United States Patent [19]

Ahne et al.

[11] 4,311,785
[45] Jan. 19, 1982

[54] METHOD FOR THE PREPARATION OF HIGHLY HEAT-RESISTANT RELIEF STRUCTURES AND THE USE THEREOF

[75] Inventors: Hellmut Ahne, Röttenbach; Eberhard Kühn, Hemhofen; Roland Rubner, Röttenbach; Erwin Schmidt, Erlangen, all of Fed. Rep. of Germany

[73] Assignee: Siemens Aktiengesellschaft, Munich, Fed. Rep. of Germany

[21] Appl. No.: 179,454

[22] Filed: Aug. 19, 1980

[30] Foreign Application Priority Data

Aug. 21, 1979 [DE] Fed. Rep. of Germany ....... 2933827

[51] Int. Cl.³ ................................................ G03C 1/70
[52] U.S. Cl. .................................... 430/283; 430/285; 430/286; 430/287; 430/288; 430/296; 430/303; 430/306; 430/906; 430/908
[58] Field of Search ............... 430/283, 285, 286, 287, 430/288, 296, 303, 306, 906, 908

[56] References Cited

U.S. PATENT DOCUMENTS 3,957,512  5/1976  Kleeberg et al. ................... 430/325

Primary Examiner—John D. Welsh
Attorney, Agent, or Firm—Kenyon & Kenyon

[57] ABSTRACT

The invention relates to a method for the preparation of highly heat-resistant relief structures on the basis of polyimides, polyisoindoloquinazoline diones, polyoxazine diones and polyquinazoline diones by applying radiation-sensitive soluble polymer precursor stages to a substrate in the form of a film or a foil; irradiating the film or the foil through negative patterns with actinic light or by deflecting a light, electron or ion beam; removing the non-irradiated film or foil portions and optionally, by subsequent annealing; as well as the use of relief structures so prepared. It is an object of the invention to simplify the preparation of relief structures of the type mentioned. For this purpose, it is provided to use as the polymer precursor stages addition products of olefinically unsaturated monoepoxides to carboxyl group-containing polyaddition products of aromatic and/or heterocyclic tetracarboxylic acid dianhydrides and diamino compounds or diamino compounds with at least one orthoposition amido group or of aromatic and/or heterocyclic dihydroxy dicarboxylic acids or corresponding diamino dicarboxylic acids and diisocyanates. The relief structures prepared by the method according to the invention are suitable in particular for use as a resist, surface coating material and insulating material.

9 Claims, No Drawings

METHOD FOR THE PREPARATION OF HIGHLY HEAT-RESISTANT RELIEF STRUCTURES AND THE USE THEREOF

BACKGROUND OF THE INVENTION

The present invention relates to a method for the preparation of highly heat-resistant relief structures on the basis of polyimides, polyisoindoloquinazoline diones, polyoxazine diones and polyquinazoline diones by applying radiation-sensitive soluble polymer precursor stages in the form of a film or a foil on a substrate; irradiating the film or the foil through negative patterns with actinic light or by deflecting a light, electron or ion beam; removing the non-irradiated film or foil portions and, if desired, subsequent annealing, as well as to the use of relief structures prepared in this manner.

A method for the preparation of relief structures of the type mentioned is known from German Pat. No. 2 308 830 and its corresponding U.S. Pat. No. 3,957,512. In this method, polyaddition or polycondensation products of polyfunctional carbocyclic or heterocyclic compounds, carrying radiation-sensitive radicals, with diamines, diisocyanates, bis-acid chlorides or dicarboxylic acids are used as soluble polymer precursor stages. The compounds which carry radiation-sensitive radicals contain two carboxyl, carboxylic-acid chloride, amino, isocyanate or hydroxyl groups suitable for addition or condensation reactions, and (. . .) radiation-reactive groups (partially, in ortho- or peri-position thereto,) bound to carboxyl groups in ester fashion. The diamines, diisocyanates, bis-acid chlorides and dicarboxylic acids to be reacted with these compounds have at least one cyclic structure element.

The soluble polymer precursor stages are cross-linked upon irradiation and change into insoluble intermediate products. These intermediate products are subject to cyclization by annealing, whereby highly heat-resistant polymers of the following material classes are formed: Polyimides, polyamidimides, polyester imides, poly-1,3-quinazoline-2,6-diones, polyisoindoloquinazoline diones, poly-1,3-oxazine-6-ones and polybenz-1,3-oxazine-2,4-diones.

The relief structures prepared by the known method have been well accepted in practice. However, it has been found that difficulties still arise which are due to the polymer precursor stages; to wit, due to the manufacturing process, in which acid chlorides are utilized, these polymer precursor stages have a residual chlorine content which can be eliminated only to a limited extent and at great cost. In addition, the use of polymer precursor stages with improved solubility is also desirable.

SUMMARY OF THE INVENTION

It is an object of the present invention to improve the method of the type mentioned at the outset for the preparation of highly heat-resistant relief structures, achieving, in particular, greater purity of the relief structures and, in addition, a simplified preparation.

According to the invention, this and other objects are achieved by the provision that addition products of olefinically unsaturated monoepoxides on either: (a) carboxyl group-containing polyaddition products of aromatic and/or heterocyclic tetracarboxylic-acid dianhydrides and diamino compounds (or diamino compounds with at least one ortho-position amido group), or (b) carboxyl group-containing polyaddition products of aromatic and/or heterocyclic dihydroxy dicarboxylic acids (or corresponding diamino dicarboxylic acids) and diisocyanates, are utilized as polylmer precursor stages.

By the method according to this invention, relief structures can be prepared in a simplified manner because the polymer precursor stages used in the process can be processed, at least partially, in or from partially aqueous solution, due to the presence of hydroxyl groups. In addition, the relief structures prepared by the method according to this invention are of increased purity, the lack of chlorine impurities being particularly important.

In the method according to the present invention, the polymer precursor stages can advantageously be utilized together with light- or radiation-sensitive co-polymerizable compounds. For this purpose, N-substituted maleic imides preferably are used. However, acrylate- or methacrylate-group-containing compounds can also be used. Furthermore, conventional photo initiators and/or sensitizers can be used (see: "Industrie Chimique Belge", 24, 1959, pages 739 to 764, as well as J. Kosar, "Light-Sensitive Systems", John Wiley & Sons, Inc., New York 1965, pages 143 to 146 and 160 to 188). Particularly well suited materials for this purpose are Michler's ketone and/or benzoine ether; 2-tertbutyl-9,10-anthraquinone; 1,2-benz-9,10-anthraquinone; and 4,4'-bis(diethylamino)-benzophenone. With the method according to this invention, adhesion agents can further be used to advantage. This purpose is served particularly by silanes such as vinyl-triethoxy silane; vinyl-tris($\beta$-methoxy-ethoxy)-silane; $\gamma$-methacryloxy-propyl-trimethoxy silane; and $\gamma$-glycidoxy-propyl-trimethoxy silane.

The radiation-sensitive precursor stages used in the method according to the invention, which are of an oligomeric and/or polymeric nature, are described in the simultaneously filed U.S. patent application Ser. No. 179,453. These precursor stages exhibit generally the following structure:

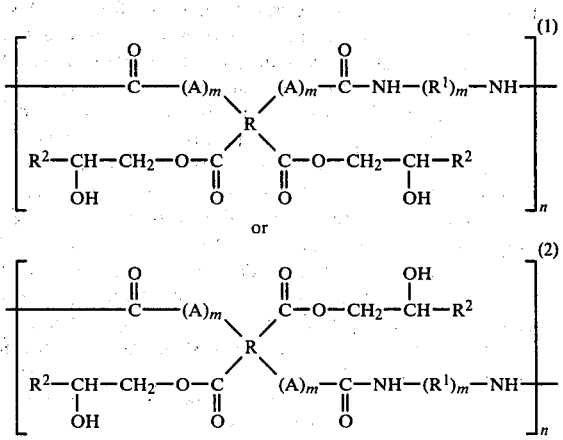

In Formulas (1) and (2), n is an integral number from 2 to about 100 and m is 0 or 1.

For R, $R^1$, $R^2$ and A, the following applies:

R is an optionally halogenated, at least partially aromatic and/or heterocyclic tetravalent, i.e., tetrafunctional, radical, in which two valences always are arranged adjacent to each other; if the radical R has several aromatic and/or heterocyclic structural elements, then the valence pairs are positioned at such end-positioned structural elements;

$R^1$ is an optionally halogenated divalent, i.e., difunctional, radical having an aliphatic and/or cycloaliphatic structure which may optionally have hetero atoms, and/or having aromatic and/or heterocyclic structure;

$R^2$ is an olefinically unsaturated radical, for example, an allyl-ether-containing group, particularly an optionally substituted, (meth) acryl-ester-containing group; and A stands for —O— or —NH—.

Preferred are addition products of glycidyl acrylate or methacrylate on the polyaddition product of pyromellithic-acid or benzophenone-tetracarboxylic-acid dianhydride and diaminodiphenyl ether and addition products of glycidyl acrylate or methacrylate on the poly-addition product of dihydroxydiphenylmethane dicarboxylic acid and diphenylmethane diisocyanate. Examples of such polymer precursor stages are shown in the following formulas (3) and (4):

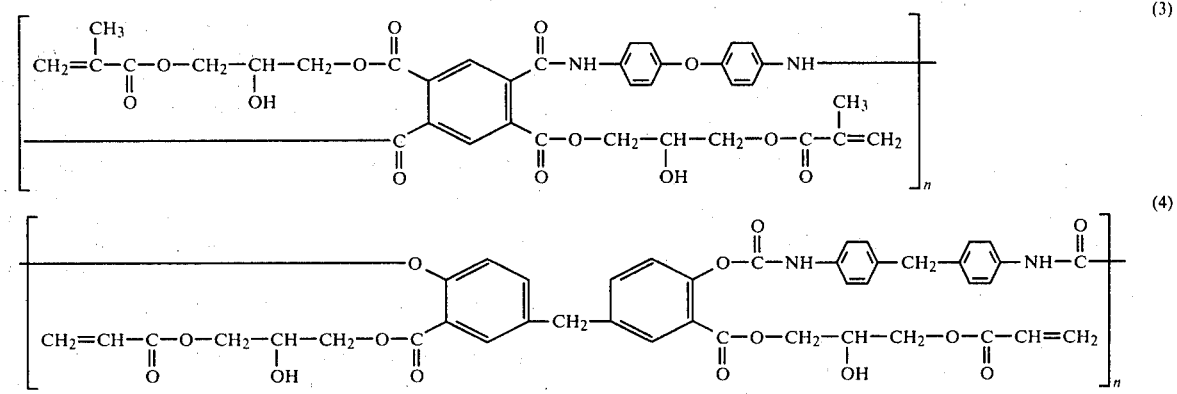

Formula (3) shows a polyimide precursor stage and Formula (4) a polyoxazine dione precursor stage.

As earlier explained, the relief structures according to the invention are prepared in such a manner that the polymer precursor stage in the form of a film or a foil is applied to a substrate and is exposed through a mask with actinic light or is irradiated by deflecting a light, electron or ion beam; subsequently, the non-exposed or non-irradiated film or foil portions are dissolved or stripped off and the relief structures so obtained are, if desired, annealed. The precursor stage can advantageously be applied to the substrate dissolved in an organic solvent, N-methylpyrrolidone being preferred as the solvent for this purpose. The concentration of the solution can be adjusted so that layer thicknesses of 0.01 to several hundred μm can be produced by known coating methods such as centrifuging, immersion, spraying, brushing or rolling-on. It has been found, for example, that with centrifuge-coating, 300 to 10,000 RPM for 1 to 100 seconds are suitable for obtaining a uniform and good surface quality. The photo resist layer applied to the substrate, which consists preferably of glass, metal, plastic or a semi-conductor material, can be freed of the solvent at room temperature or at elevated temperature, preferably at a temperature of 50° to 80° C., in a nitrogen or air stream. It also is possible to perform this process in a vacuum.

To obtain a large enough difference in solubility between the irradiated and the non-irradiated layer or foil portions, exposure times between about 20 and 800 seconds, depending upon the composition and the layer thickness, are sufficient with the method according to the present invention, provided a 500-W very-high pressure mercury lamp is used. After exposure, the unexposed portions of the film or the foil are dissolved, preferably with an organic developer.

By means of the method according to the present invention, images with sharp contours, i.e., relief structures, are obtained which are converted by annealing into highly heat-resistant polymers which are resistant to acids and alkaline solutions. In general, annealing temperatures of about 220° to 500° C. can be chosen, preferably temperatures of 300° to 400° C., and the annealing time is generally about half an hour. No discoloration is observed in inert gas. The edge sharpness and dimensional accuracy of the relief structures are practically unimpaired by the annealing. In addition, the high surface quality of the relief structures is preserved in spite of a loss of layer thickness which occurs during the anneal.

In the method according to the present invention, polymer precursor stages of aromatic components preferably are utilized, such that in the thermal treatment, i.e., in the annealing process, polymers with the following structure units are formed:

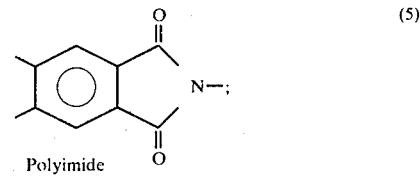

Polyimide (5)

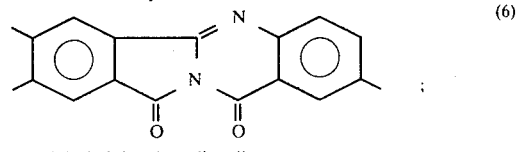

Polyisoindoloquinazoline dione (6)

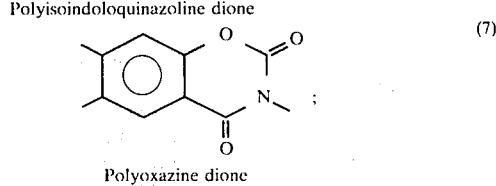

Polyoxazine dione (7)

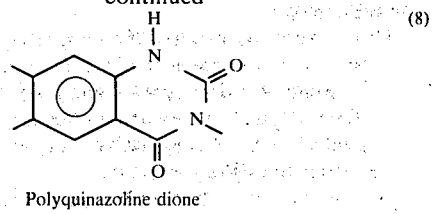

Polyquinazoline dione

The term "polyimides" also includes polyester imides (9) and polyamidimides (10).

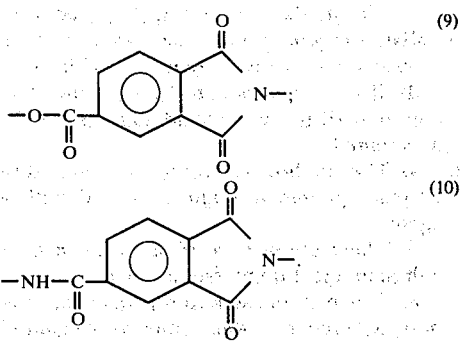

The classes of compounds mentioned are among the semiladder polymers or ladder polymers, respectively, and are distinguished by high temperature resistance (up to about 500° C.).

The relief structures according to the present invention can be used for the preparation of passivating layers on semiconductor components, thin- and thick film circuits, solder protection layers on multilayer circuits, insulating layers as a component of multilayer circuits and miniaturized insulating layers on electrically conductive and/or semiconductor and/or insulating base materials, particularly in the field of microelectronics or generally, for the fine structuring of substrates. The highly heat-resistant relief structures preferably serve as masks for wet and dry-etching processes, electroless or electrolytic metal deposition and vapor deposition processes as well as for ion implantation masks, and in addition, as insulating and protection layers in electrotechnology. The relief structures can further be utilized to advantage as orientation layers, for example, in liquid-crystal displays, as well as for rastering of surfaces, for example, for x-ray screens and particularly in x-ray image amplifiers.

DETAILED DESCRIPTION OF THE INVENTION

The invention will now be explained in further detail with the aid of the following non-limiting, embodiment examples.

EXAMPLE I

Preparation of a Radiation-Reactive Polyimide Precursor Stage

To 65.4 parts by weight pyromellithic-acid dianhydride (0.3 mol) in 450 parts by volume dimethylacetamide are added 45 parts by weight 4,4'-diaminodiphenyl ether (0.23 mol) while stirring, and stirring is subsequently continued for 2 hours at room temperature. Then 2 parts by weight methacrylic acid-2-hydroxyethyl ester (0.016 mol) are added to the reaction mixture so as to bind the still present end-position anhydride groups. After stirring for 2 hours at room temperature, 150 parts by volume glycidyl methacrylate, 1.5 parts by weight benzyldimethylamine and 0.1 part by weight hydroquinone are added to the reaction mixture. Subsequently, the solution is heated to a temperature of 50° to 60° C. for 23 hours while stirring and it is then added dropwise to 4000 parts by volume ethanol while stirring vigorously. The precipitate so formed is drawn off and is dried in a vacuum at room temperature.

PREPARATION OF THE RELIEF STRUCTURE 20 parts by weight of the polyimide precursor stage prepared in the manner described above are dissolved, together with 1 part by weight N-phenylmaleinimide and 0.4 parts by weight Michler's ketone as well as 0.2 parts by weight vinyltriethoxy silane, in 80 parts by volume dimethylacetamide. The solution is filtered through a filter and centrifuged at 2500 RPM to form uniform films on an aluminum foil and a silicon wafer with a silicon nitride surface. After drying, the film thickness is 2.5 μm. The films are then exposed with a 500-W very-high-pressure mercury lamp through a contact mask for 40 seconds and are subsequently developed for 20 seconds in dimethylacetamide or for 40 seconds in a mixture of dimethylacetamide and γ-butyrolactone (volume ratio 1:1). Relief structures with sharp edges are obtained and the resolution achieved is better than 4 μm. The relief structures are not imparied by subsequent annealing at 400° C. (duration: 30 minutes).

The relief structures prepared in the manner described exhibit the excellent thermal, electrical, chemical and mechanical properties of the polyimide polydiphenylether pyromellithic imide. The IR spectrum of the annealed samples shows the band at 5.6 μm typical of the imide structure.

EXAMPLE II

Preparation of a Radiation-Reactive Polybenzoxazine Dione Precursor Stage

To a solution of 28.8 parts by weight methylene disalicylic acid (0.1 mol) and 0.1 parts by weight 1,4-diazabicyclo [2,2,2] octane as catalyst in 100 parts by volume N-methylpyrrolidone, 25 parts by weight diphenylmethane diisocyanate (0.1 mol), dissolved in 50 parts by volume N-methylpyrrolidone, are slowly added dropwise at room temperature while stirring. After a reaction time of 20 hours at room temperature, 75 parts by volume glycidyl acrylate and 0.1 parts by weight hydroquinone are added to this solution while stirring. After a further reaction time of 20 hours at a temperature of 50° to 60° C. and 48 hours at room temperature, the resin is precipitated with 2000 parts by volume toluene and dried in a vacuum.

Preparation of the Relief Structure 10 parts by weight of the polybenzoxazine dione precursor stage prepared in the manner described above, 0.5 parts by weight N-phenylmaleinimide, 0.2 parts by weight Michler's ketone and 0.1 parts by weight vinyltriethoxy silane are dissolved in 30 parts by volume of a mixture of dimethylacetamide and dioxane (volume ratio 1:1). The solution is filtered and centrifuged at 2500 RPM on an aluminum foil as well as a silicon wafer to form homogeneous films. After drying for 2 hours at 70° C. in a vacuum, the films are exposed with a 500-W very-high-pressure mercury lamp through a grid-structure test mask by the contact process for 30 seconds; developing then follows for 5 to 10 seconds with a mixture of γ-butyrolactone and toluene (volume ratio 1:1) and washing with toluene.

In this manner, a resolution of 3 μm with sharp edges of the relief structures is obtained. The relief structures can be annealed for ½ hour at 275° C. and half an hour at 400° C. without impairment of the resolution and the edge sharpness. The layer thickness is 1.1 μm with a starting layer thickness of 2.5 μm.

Within the scope of the present application, "tetracarboxylic-acid dianhydride" is understood to describe compounds which have at least two acid anhydride groupings. The term "diamino compounds" also includes compounds which contain the structural element >N—N<, i.e., derivatives of hydrazine. "Diamino compounds with at least one ortho-position amido group" are understood to mean compounds which carry at least one amino group in ortho-position to one of the two amino groups.

The relief structures according to the invention are preferably suitable for application as a resist with intermediate protective function for lithographic structuring of surfaces, particularly for the dry etching process, or for permanent coating or screening of surfaces, or as a protective or insulating material for electrical engineering purposes.

What is claimed is:

1. In a method for the preparation of highly heat-resistant relief structures on the basis of polyimides, polyisoindoloquinazoline diones, polyoxazine diones and polyquinazoline diones wherein radiation-sensitive, soluble polymer precursor stages are applied in the form of a film or a foil to a substrate; the film or foil is irradiated through negative patterns with actinic light or by deflection of a light, electron or ion beam; and the non-irradiated film or foil portions removed, the improvement comprising utilizing as said polymer precursor stage an addition product of an olefinically unsaturated monoepoxide on a product selected from the group consisting of:
   (a) a carboxyl-group-containing polyaddition product of an aromatic and/or heterocyclic tetracarboxylic acid dianhydride and a compound selected from the group consisting of a diamino compound and a diamino compound having at least one ortho-position amido group; and
   (b) a carboxyl-group-containing polyaddition product of (1) a compound selected from the group consisting of an aromatic and/or heterocyclic dihydroxy dicarboxylic acid and a corresponding diamino dicarboxylic acid, and (2) a diisocyanate.

2. The method according to claim 1 wherein said polymer precursor stage is utilized together with light- or radiation-sensitive copolymerizable compounds.

3. The method according to claim 2 wherein said copolymerizable compound comprises an N-substituted maleinimide.

4. The method according to claim 1 wherein said polymer precursor stage is utilized with an adhesion agent.

5. The method according to claim 4 wherein said adhesion agent comprises a silane.

6. The method according to claim 1 wherein said polymer precursor stage comprises an addition product of glycidyl acrylate or methacrylate on the polyaddition product of diamino diphenyl ether and a member selected from the group consisting of pyromellithic acid and benzophenone tetracarboxylic acid dianhydride.

7. The method according to claim 1 wherein said polymer precursor stage comprises an addition product of glycidyl acrylate or methacrylate on the polyaddition product of dihydroxy diphenylmethane dicarboxylic acid and diphenylmethane diisocyanate.

8. The method according to claim 1 wherein said film or foil from which non-irradiated portions have been removed is subsequently annealed.

9. Highly heat-resistant relief structures prepared according to the method of claim 1.

* * * * *